United States Patent [19]

Graham et al.

[11] Patent Number: 5,144,595

[45] Date of Patent: Sep. 1, 1992

[54] ADAPTIVE STATISTICAL FILTER PROVIDING IMPROVED PERFORMANCE FOR TARGET MOTION ANALYSIS NOISE DISCRIMINATION

[75] Inventors: Marcus L. Graham, North Kingstown; Francis J. O'Brien, Newport, both of R.I.

[73] Assignee: The United States of America as represented by the Secretary of the Navy, Washington, D.C.

[21] Appl. No.: 825,909

[22] Filed: Jan. 27, 1992

[51] Int. Cl.⁵ .............................................. G01S 15/66
[52] U.S. Cl. .................................... 367/135; 367/901; 364/517
[58] Field of Search ................ 367/135, 901; 342/195; 364/517, 574, 724.19

[56] References Cited

U.S. PATENT DOCUMENTS 5,067,096 11/1991 Olson et al. ......................... 364/517

Primary Examiner—Daniel T. Pihulic
Attorney, Agent, or Firm—Michael J. McGowan; Prithvi C. Lall; Michael F. Oglo

[57] ABSTRACT

The adaptive statistical filter providing improved performance target motion analysis noise discrimination of the present invention includes a bank of parallel Kalman filters. Each filter estimates a statistic vector of specific order, which in the exemplary third order bank of filters of the preferred embodiment, respectively constitute coefficients of a constant, linear and quadratic fit. In addition, each filter provides a sum-of-squares residuals performance index. A sequential comparator is disclosed that performs a likelihood ratio test performed pairwise for a given model order and the next lowest, which indicates whether the tested model orders provide significant information above the next model order. The optimum model order is selected based on testing the highest model orders. A robust, unbiased estimate of minimal rank for information retention providing computational efficiency and improved performance noise discrimination is therewith accomplished.

10 Claims, 2 Drawing Sheets

ADAPTIVE STATISTICAL FILTER PROVIDING IMPROVED PERFORMANCE FOR TARGET MOTION ANALYSIS NOISE DISCRIMINATION

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The instant invention is directed to the field of signal processing, and more particularly, to an adaptive statistical filter providing improved performance for target motion analysis noise discrimination.

(2) Description of the Prior Art

Target motion analysis processors are employed wherever it is desirable to determine the range, velocity and bearing of a remote target. The typical target motion analysis processing system includes some sort of a data sensor, such as a sonar or radar, an adaptive filter coupled to the data sensor and a target motion analysis processing module coupled to the adaptive filter.

The sensor is responsive to the radiation emitted by or reflected off the target to provide a data stream representative thereof. The character of the data stream, in any given case, has different "static" and "dynamic" characteristics that depend upon the relative velocities of, and relative positions defined between, the data sensor and the remote target, as well as upon the state of the noise in the communication channel therebetween, among other factors.

The adaptive filter adaptively filters the data stream to extract the "static" and "dynamic" characteristics of the data stream from noise, and the target motion analysis processing module is responsive to the extracted characteristics of the data stream to provide estimates of the bearing, range and velocity of the remote target.

However, the heretofore known adaptive filters were fixed-order filters, so that, depending on the particular order of the fixed-order adaptive filter, it often happened that the noise represented by the "static" and "dynamic" characteristics of the data stream provided by the data sensor was on the order of at least one of the predetermined number of parameters being estimated by the fixed-order adaptive filters. Being thus disabled from distinguishing noise from target information, the heretofore known target motion analysis processing systems having fixed-order adaptive filters were thus subjected to non-optimum performance to a degree that depended on the degree to which the noise characteristics of the measurement data stream were on the order of one or more of the predetermined number of parameters estimated by the fixed-order adaptive filters.

SUMMARY OF THE INVENTION

It is accordingly the principal object of the present invention to provide an optimum order target motion analysis processing system that is operative to determine the optimum order of the adaptive filter that best describes the particular dynamics and noise content of the measurement data on each leg of a multiple leg data gathering sequence and to provide estimates of range, velocity and bearing to remote target objects based on optimized parameters, that may vary from data gathering leg to data gathering leg, thereby improving the quality of remote target motion estimation. In accordance therewith, the processing system of the present invention discloses an optimum order selector coupled between the data sensor and the target motion analysis processing module. The optimum order selector is constituted by plural adaptive filters each of a different order that are coupled in parallel to the data sensor. Each adaptive filter of different order in the preferred embodiment is a linear Kalman filter operative to provide estimates of a predetermined number of coefficients corresponding to the particular order of that adaptive filter. Each of the different order adaptive filters in accord with its particular model-order also provides a datum representative of how well each set of filter coefficients corresponding to its particular model-order fits the data provided by the data sensor. In the preferred embodiment, the datum preferably is a sum-of-squares residuals performance index. The optimum order selector is further constituted by a sequential comparator module. The sequential comparator module is coupled to each of the different order adaptive filters. The sequential comparator module is operative to compare the datum representative of the degree of fit of the different sets of model-order adaptive filter coefficients to the same measurement data stream pairwise, and to determine sequentially for each compared pair of different order adaptive filters a predetermined significance of the variation therebetween. The sequential comparator module in the preferred embodiment preferably is a F-test module. The optimum order selector is further constituted by an optimum model-order and parameter estimate selector module that is coupled to the sequential comparator module. The optimum model-order and parameter estimate selector module is operative in response to the predetermined significance of the pairwise comparison to determine the optimum model-order. In the preferred embodiment, the optimum model order and parameter estimate selector module is operative to compare the probability of the F-statistics provided by the sequential comparator module with a predetermined threshold, the probability of false alarm in the preferred embodiment, and to output the results of the highest order filter for which the threshold is exceeded. A target motion analysis processing module is coupled to the optimum model order and parameter estimate selector module and is responsive to the optimum set of coefficients output by the optimum order adaptive filter to calculate the range, bearing, and velocity of the target object. In this manner, target observability is accomplished with maximum noise filtration without loss of target information and with minimized computational and data storage requirements.

BRIEF DESCRIPTION OF THE DRAWINGS

These and other objects, features and advantages of the present invention will become apparent as the invention becomes better understood by referring to the following detailed description of the invention, and to the drawings, wherein.

DESCRIPTION OF THE PREFERRED EMBODIMENT

Figure 1:
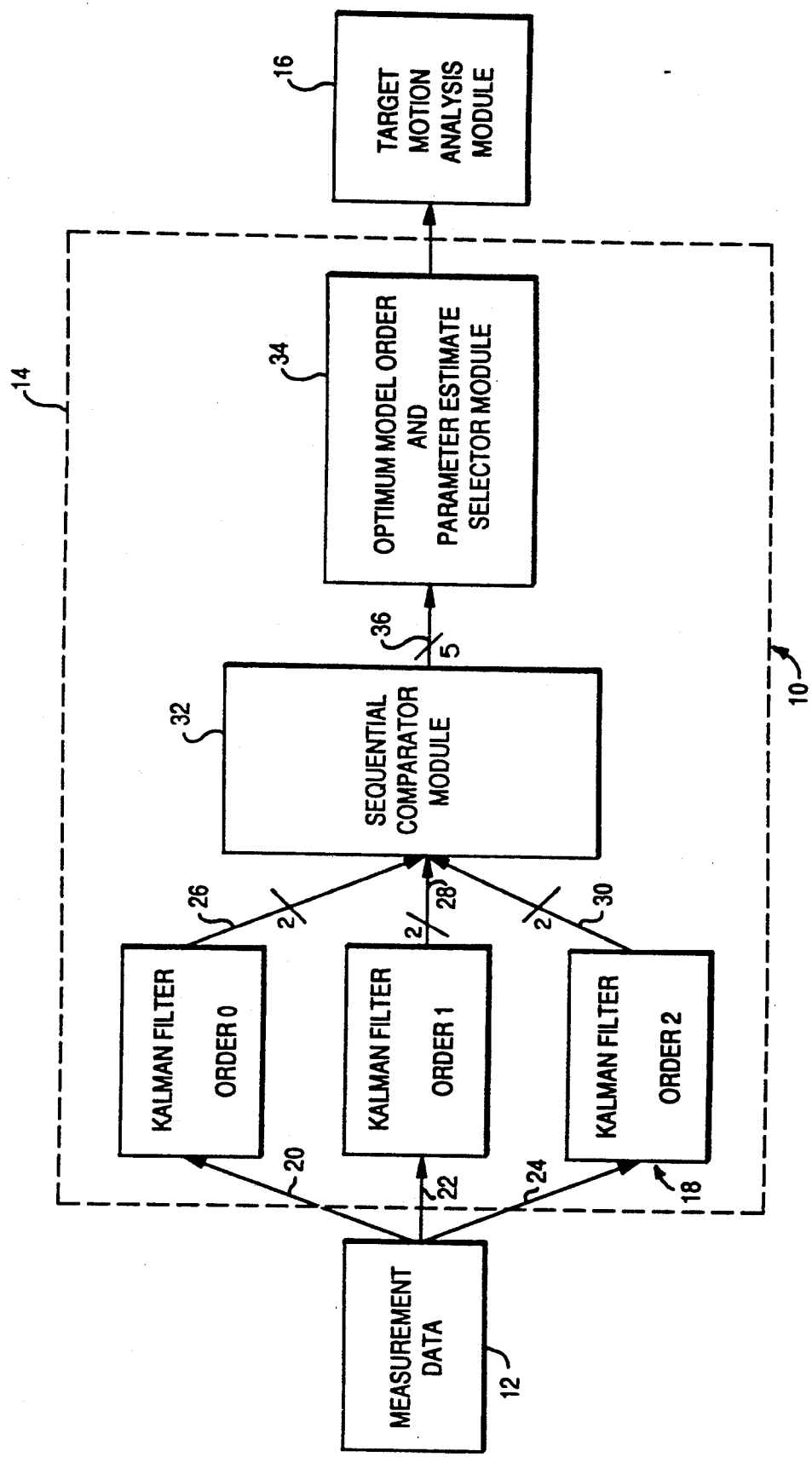
FIG. 1 is a block diagram illustrating the improved target motion analysis processor of the present invention.

Referring now to FIG. 1, the data gathering and processing system of the present invention is generally designated at 10, and includes a data sensor subsystem 12 providing measurement data corrupted by noise, an optimum filter subsystem schematically illustrated by dashed box 14 (to be described) coupled to the data sensor subsystem 12 and responsive to the measurement data to compensate the measurement data for noise in a manner to be described, and a target motion analysis module 16 coupled to the optimum filter 14 and operative to provide data representative of range, velocity and bearing to a remote target in response to the noise-compensated measurement data. The data sensor 12, and the target motion analysis (TMA) module 16, are both well known to those skilled in the art, and are not further described herein, except to note that any suitable sensor 12 and TMA module 16, such as those adapted for tactical weapons controllers for naval vessel weapons platforms, may be employed without departing from the inventive concept. The foregoing structural element "TMA module 16", represented in the drawing by a single block of the block diagrams, comprises any equipment which employs conventional target motion analysis algorithms and theories to calculate range, bearing, and/or velocity of the target object. These algorithms and theories are available in literature available to the public and are well known and understood to both systems engineers and equipment design engineers working in the field of naval sonar systems.

The term "TMA module" just used expresses in a general sense that the conventual algorithms relating to Target Motion Analysis and the theories of their application which existed in open literature enable either a system engineer or an equipment design engineer, skilled in the art to which the invention pertains, to design utilization equipment for the adaptive filter of the present invention.

The optimum filter 14 includes a bank of "k", preferably linear, Kalman filters, each having a different order "m", that are generally designated 18, where "m" goes from 0 to "k−1", an optimal filter of order "2" being specifically illustrated. The bank of "k" filters 18 are connected in parallel to the data sensor 12 as illustrated by lines designated 20, 22 and 24, so that each of the filters of the bank of filters 18 receives the same noise-corrupted data signal output by the data sensor 12.

Each Kalman filter of the bank of Kalman filters 18 is operative in a manner to be described to provide a first signal having m+1 coefficients representative of the fit of a different preselected "$m^{th}$" order polynomial to the same noise-corrupted measurement data and to provide a second performance index signal representative of the degree of the fit of the different "$m^{th}$" order polynomials severally to the same measurement data. The aforesaid coefficients of the first signal may sometimes in this specification, and the drawings and claims appended thereto, be referred to as "fit coefficients". These first and second signals are schematically illustrated in FIG. 1 as the dual-lines 26, 28, and 30 (i.e., each of which carries two signals). In the exemplary embodiment where each of the filters of the bank of filters 18 are linear Kalman filters, the preselected "$m^{th}$" order polynomials of the first signals are preferably selected to be polynomials having linear-coefficients, and the preselected performance index second signals are selected to be a sum of squares residuals performance index, although first signals other than those based on linear coefficient expansions and performance index second signals other than those based on sums of squares residuals are possible without departing from the scope of the instant invention.

The preferred operation of each of the linear Kalman filters of the bank of Kalman filters 18 that provide the first and second signals of the preferred embodiment are governed by the following relations, where the first signals are iteratively determined jointly by a state variable and a covariance matrix over the duration of successive data processing intervals, which data processing intervals are well known to those skilled in the art, where the second signals are iteratively determined by a sum-of-squares residuals performance index over the duration of successive data processing intervals, where the sum of squares residuals performance index is initialized with "0" at time "0", and where the covariance matrix is initialized with the scaled identity matrix at time "0".

The state vector, x (n,n−1), is adaptively predicted iteratively in each "$(m-1)^{st}$" order linear Kalman filter from time n-1 to time n in accord with the relation:

$$X(n,n-1) = A(n,n-1)x(n,n-1) \quad (1)$$

where A(n,n−1) is the mxm state transition matrix for time n−1 to time n, for model of rank m.

The mxm covariance matrix, P(n,n−1), is adaptively predicted iteratively from time n−1 to time n in accord with the relation:

$$P(n,n-1) = A(n,n-1)P(n-1,n-1)A^T(n,n-1) \quad (2)$$

A Kalman gain, G(n), is iteratively predicted in accord with the relation:

$$G(n) = P(n,n-1)H^T(n,n-1)[H(n,n)P(n,n-1)H^T(n,n-)+R(n)]^{-1} \quad (3)$$

where H(n,n) is the kxm observation matrix for measurement vectors of length k, and R(n) is the kxk measurement covariance matrix. A measurement residual, $\delta(n)$, is iteratively predicted in accord with the relation:

$$\delta(n) = z(n) - H(n,n)x(n,n-1) \quad (4)$$

for the k dimensional measurement vector z(n).

The state vector, x(n,n−1), is updated iteratively in accord with the relation:

$$x(n,n) = x(n,n-1) + G(n)\delta(n) \quad (5)$$

the covariance matrix P(n,n−1) is updated iteratively in accord with the relation:

$$P(n,n) = [I - G(n)A^T(n,n-1)]P(n,n-1) \quad (6)$$

the weighted sum of squared residuals performance index PI(n) is iteratively updated in accord with the relation:

$$PI(n) = PI(n-1) + \delta^T(n)[H(n,n)P(n,n-1)H^T(n,n)+R(n)]^{-1}\delta(n) \quad (7)$$

In the above relations, the superscripts "T" designate the transpose of the corresponding matrix.

Returning now to FIG. 1, a sequential comparator module 32 is coupled to each of the Kalman filters of the bank of Kalman filters 18 via the dual-lines 26, 28, 30. Module 32 is operative to compare in accord with a predetermined relation the corresponding ones of highest and next-to-highest order second signals pairwise and to provide third signals representative of whether or not any difference therebetween is beyond a predetermined threshold. In the preferred embodiment, the predetermined relation is an "F-statistic" defined between the respective sums of squared residuals performance index second signals of the corresponding "$m^{th}$ order and "$(m-1)^{st}$" order linear Kalman filters taken pairwise, and the predetermined threshold is a preselected "F-test" significance, preferably ninety-five percent (95%), although other predetermined relations and thresholds may be employed as well without departing from the inventive concept. The operation of module 32, the principles governing the predetermined relation "F-statistic", and the principles governing the "F-test" threshold, will be discussed in more detail hereinafter.

An optimum model order and parameter estimator module 34 is coupled to the sequential comparator module 32. The optimum model order and parameter estimator module 34 is operative in response to a total of $(2k-1)$ combinations of first and third signals to select as optimum the highest order first signal of that third signal that first exhibits a difference beyond the predetermined threshold, and otherwise to select as optimum the lowest order signal. The equation symbol "k" has been hereinbefore defined as the number of individual Kalman filters in bank of filters 18. Thus, for the exemplary second order optimum filter of the preferred embodiment (which consists of a bank of three (3) individual Kalman filters) there are a total of five (5) combinations of first and third signals. The paths of these five signals out of module 32 are schematically represented in the drawing as a quintuple-line 36 leading to module 34.

Returning to the description of how sequential comparator module 32 operates, it first determines whether the F-statistic defined with respect to the second signals for the filters of model orders "2" and "1" exceeds the "F-test" threshold for that pair and selects the corresponding first signal of the Kalman filter of the bank of Kalman filters 18 of model order "2" if the F-test is above threshold. (As noted earlier, the first and second signals from each of individual model order filters of filter bank 18 are communicated to module 32 via one and the other line of dual lines 26, 28 and 30 going from the individual model order filters to module 32.) However, if the F-test for that pair is below threshold, module 32 determines whether the F-statistic defined between the second signals for the filters of model orders "1" and "0" exceeds the F-test threshold for that pair. If the index exceeds the predetermined threshold the corresponding first signal of the Kalman filter of the bank of Kalman filters 18 of model order "1" is selected. But if the F-test for this pair is below threshold, the corresponding first signal of the model-order "0" Kalman filter of the bank of Kalman filters 18 is selected.

Figure 2:
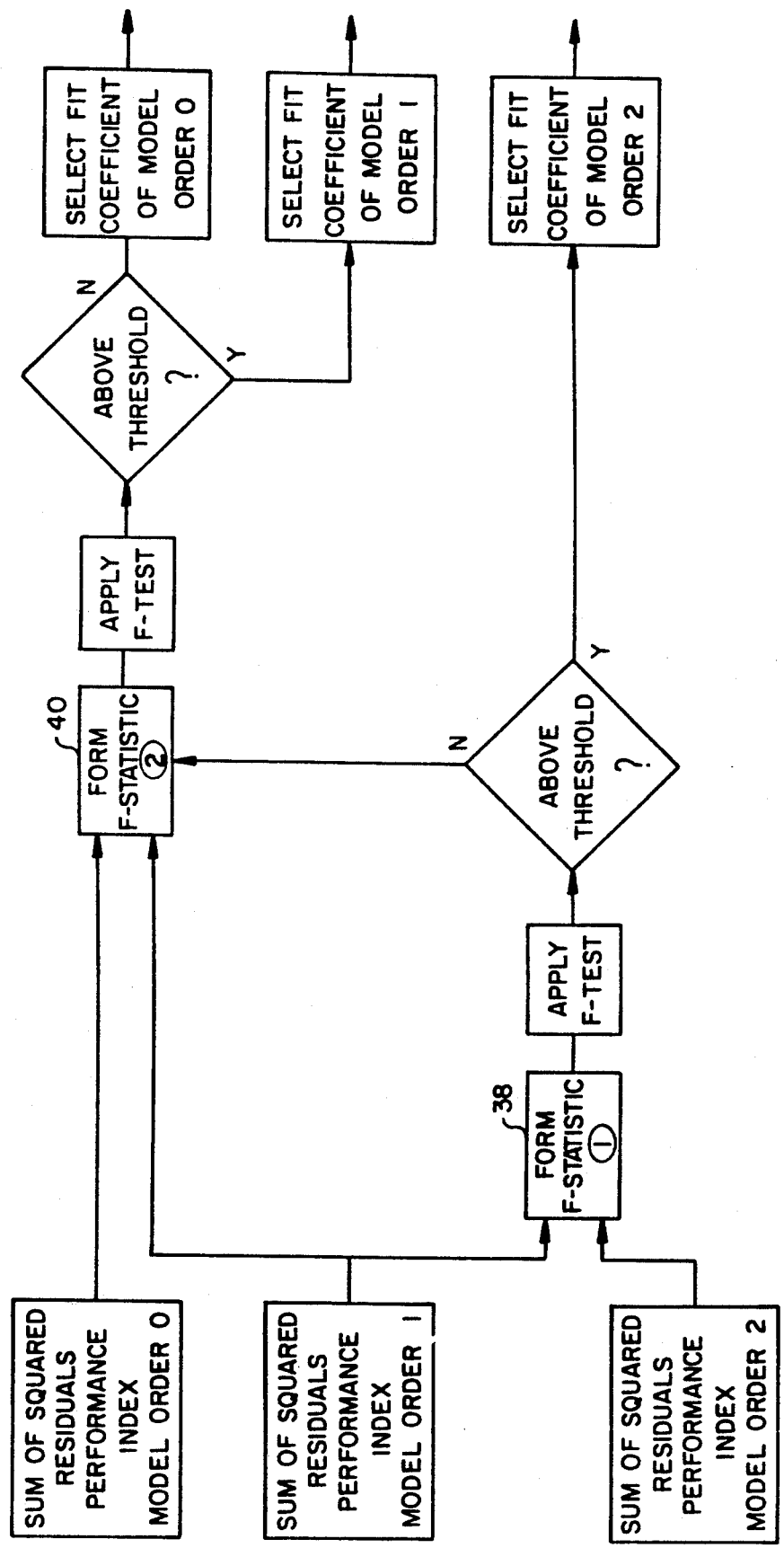
FIG. 2 is a logic flow chart of the operation of certain components of FIG. 1.

The logic which sequential comparator module 32 and optimum model order and parameter estimate selector module 34 implement in their operation is schematically depicted in the logic flow chart of FIG. 2. In interpreting this flow chart, it is to be understood that operation steps 38 and 40 of forming an "F-statistic" with respect to comparisons of the sum-of-squared-residuals performance indices for the filter model order pairs "2" and "1", and "1" and "0" are performed in the sequential order indicated by the encircled numbers depicted on boxes 38 and 40, and not simultaneously.

The preferred operation of the sequential comparator module 32 and optimum model order and parameter estimate selector module 34 that outputs the optimum set of coefficients to the target motion analysis module 16 of the presently preferred embodiment are governed by the following relations.

The F test, $F_1$, between the highest and next to highest order model order second signals in the exemplary case of a highest model order of 2 is given by the relation:

$$F_1 = (N - 3) \frac{PI_1 - PI_2}{PI_2} \qquad (8)$$

where N is the number of measurements and $PI_j$ is the performance index from model order j. $F_1$ follows an F distribution with $v_1=1$, $v_2=N-3$ degrees of freedom.

The complement of the cumulative probability distribution function for F, given in accord with the relation:

$$Q(F|v_1,v_2) = 1 - P(F|v_1,v_2) \qquad (9)$$

is preferably used to assess the decision between the model orders 1 and 2.

The exact probabilities are preferably computed by series expansions on $Q(F|v_1, v_2) = 1 - P(F|v_1,v_2)$. Further information with respect to this condition may be found in M. Abramovitz and I. A. Stegun, *Handbook of Mathematical Functions with Formulas, Graphs, and Mathematical Tables*, National Bureau of Standards, Washington, D.C., 1972, pp. 946-947, incorporated herein by reference. The appropriate series expansion formula depends on the current status of $v_2$. When $v_2$ is even the series expansion formula takes the form:

$$Q(F|v_1, v_2) = 1 - (1-x)^{\frac{v_1}{2}} \left[ 1 + \frac{v_1}{2}x + \frac{v_1(v_1+2)}{2 \cdot 4}x^2 + \ldots + \frac{v_1(v_1+2)\ldots(v_2+v_1-4)x^{\frac{v_2-2}{2}}}{2 \cdot 4 \ldots (v_2-2)} \right] \qquad (10)$$

where $$x = \frac{v_2}{v_2 + v_1 F}. \qquad (11)$$

When $v_2$ is odd, the series expansion formula takes the form:

$$Q(F|v_1, v_2) = 1 - \frac{2}{\pi}\left(\theta + \sin\theta \left[\cos\theta + \frac{2}{3}\cos^3\theta + \ldots + \frac{2 \cdot 4 \ldots (v_2-3)\cos^{(v_2-2)}\theta}{3 \cdot 5 \ldots (v_2-2)}\right]\right), \qquad (12)$$

where $$\theta = \tan^{-1}\sqrt{F\frac{v_1}{v_2}}.\tag{13}$$

The threshold level, $Q_c$, the probability of false alarm, is selected, and model order 2 is preferably rejected if:

$$Q(F_1|1, N-3) < Q_c \tag{14}$$

As above described, if model order 2 is rejected, decision between model order 0 and 1 takes place preferably in accord with the relation:

$$F_2 = (N-2)\frac{PI_0 - PI_1}{PI_1}.\tag{15}$$

$F_2$ follows an F distribution with $v_1 = 1$, $v_2 = N-2$ degrees of freedom.

As above described model order 1 is preferably rejected in accord with the relation:

$$Q(F_2|1, N-2) < Q_c \tag{16}.$$

If model order 1 is rejected, model order 0 is assumed.

This invention provides an automated means of optimizing the tradeoff between random estimation errors and biases on polynomial curve fits of different model orders. The model order so selected may provide insight to TMA analysts in decisions regarding which of a plurality of ranges, bearings, and velocities can be estimated with confidence from the output of the adaptive filter that is described in the present disclosed invention.

The functional elements of the process and system of FIGS. 1 and 2 may be discrete components or modules of a software program run by a computer. Alternatively, they may be discrete electrical or electronic components capable of performing the functions described herein. It is believed that one of ordinary skill in the art having the above disclosure before him could produce these components without undue experimentation.

As will be appreciated by those skilled in the art, many modifications of the presently disclosed invention will become apparent to those skilled in the art without departing from the scope of the appended claims.

What is claimed is:

1. An optimum statistical filter coupled between a data sensor providing noise-corrupted measurement data representative of a target remote from the data sensor and a target motion analysis processing module providing improved performance for target motion analysis noise discrimination, comprising:

plural statistical filter means of different orders coupled in parallel to the data sensor and each responsive to the measurement data for providing first signals having a different predetermined number of coefficients, the number corresponding to the order of respective ones of the adaptive statistical filter means, representative of the fit of predetermined different order polynomials, the order corresponding to the order of respective ones of the adaptive statistical filter means, to the same measurement data, and for providing plural second signals representative of degree of fit of the predetermined different order polynomials to the same measurement data;

sequential comparator means coupled to said plural statistical filter means and responsive to said second signals for providing plural third signals respectively representative of any difference to within a predetermined threshold of corresponding ones of highest and next-to-highest order second signals in accord with a predetermined relation; and optimum model order and parameter estimator module means coupled to the sequential comparator means and responsive to said plural third signals for selecting as optimum respectively (i) in the event the third signals exhibit a difference beyond the predetermined threshold the higher order first signal of the plural statistical filter means corresponding to that third signal that first exhibits a difference beyond the predetermined threshold, and (ii) in the event that the third signals exhibit no difference beyond the predetermined threshold the lowest order first signal of the plurality of statistical filter means.

2. The invention of claim 1 wherein said adaptive statistical filter means include linear Kalman filters.

3. The invention of claim 2 wherein each of said predetermined different order polynomials are polynomials having linear coefficients.

4. The invention of claim 3 wherein the output of the optimum model order and parameter estimator module means comprises the linear coefficient for the selected order of the first signal.

5. The invention of claim 1 wherein said second signals are sums of squares residuals performance index signals.

6. The invention of claim 1 wherein said predetermined threshold is a "F-test" probabilistic figure of merit, and wherein said predetermined relation is a "F-statistic".

7. The invention of claim 6 wherein the highest order of statistical filter means is 2, and:
said "F-statistic" relation is $$F_1 = (N-3)\frac{PI_1 - PI_2}{PI_2}$$

where N is the number of measurements and PI is the performance index from model order j.

8. The invention of claim 1, and:
target motion analysis means which receives the selected first signal from the optimum model order and parameter estimator module means.

9. The invention of claim 1 wherein the highest order of statistical filter means is 2, the possible coefficients for first signals of the plural statistical filter means corresponding coefficients of linear, binomial and quadratic adaptive filter equations.

10. The invention of claim 4 wherein:
the second signals are sums of squares residual performance signals; and
the predetermined threshold is a "F-test" probabilistic figure of merit and the predetermined relation is a "F-statistic".

* * * * *